(12) United States Patent
Osweiler

(10) Patent No.: US 9,814,315 B2
(45) Date of Patent: Nov. 14, 2017

(54) ELECTRICALLY INTEGRATED SALON STYLING CHAIR WITH ERGONOMIC EQUIPMENT CADDY

(71) Applicant: Cathryn A Osweiler, Phoenix, AZ (US)

(72) Inventor: Cathryn A Osweiler, Phoenix, AZ (US)

( * ) Notice: Subject to any disclaimer, the term of this patent is extended or adjusted under 35 U.S.C. 154(b) by 0 days.

(21) Appl. No.: 15/367,292

(22) Filed: Dec. 2, 2016

(65) Prior Publication Data
US 2017/0086586 A1 Mar. 30, 2017

Related U.S. Application Data

(63) Continuation-in-part of application No. 14/172,047, filed on Feb. 4, 2014, now Pat. No. 9,516,950.

(60) Provisional application No. 61/760,635, filed on Feb. 4, 2013, provisional application No. 62/261,905, filed on Dec. 2, 2015.

(51) Int. Cl.
*A47C 1/11* (2006.01)
*H05K 5/02* (2006.01)

(52) U.S. Cl.
CPC ............. *A47C 1/11* (2013.01); *H05K 5/0213* (2013.01); *H05K 5/0217* (2013.01); *H05K 5/0247* (2013.01)

(58) Field of Classification Search
None
See application file for complete search history.

(56) References Cited

U.S. PATENT DOCUMENTS

| | | | | |
|---|---|---|---|---|
| 5,490,712 A * | 2/1996 | Drelick | ..................... | A45C 3/00 297/188.12 |
| 5,548,843 A * | 8/1996 | Chase | ................ | A41D 13/0525 2/102 |
| 6,032,808 A * | 3/2000 | Henson | .................. | A47G 7/044 211/85.23 |
| 6,053,570 A * | 4/2000 | Stern | ........................ | A47C 7/62 211/86.01 |
| 6,216,927 B1 * | 4/2001 | Meritt | ..................... | B60R 11/02 224/275 |
| 6,581,890 B2 * | 6/2003 | Johnson | ................. | A45D 44/04 248/161 |
| 7,309,102 B1 * | 12/2007 | Davis | ..................... | B60R 7/043 224/275 |
| 7,891,733 B1 * | 2/2011 | Clarke | ..................... | A47C 7/62 211/118 |
| 8,197,000 B1 * | 6/2012 | Cohen | ..................... | A47C 4/30 297/17 |
| 8,272,686 B1 * | 9/2012 | Arnold | ................... | B60N 3/103 297/188.01 |
| 9,119,490 B1 * | 9/2015 | Parodi, Jr. | .......... | A47G 19/2205 |

(Continued)

*Primary Examiner* — David E Allred
(74) *Attorney, Agent, or Firm* — Paul B. Heynssens

(57) ABSTRACT

A salon chair with a tool caddy and an integral electrical supply. A salon chair that includes an integrated tool work station with the capacity to hold a hair dryer, curling irons, clippers and the like at the rear of the chair. The chair is powered by an integrated electrical power source inside the chairs' tool compartment and power is supplied through to the base of the chair. The power source may be connected to an outlet under the chair or concealed under a power extension with cord cover (preventing trips and falls), or may be otherwise coupled to utility power.

8 Claims, 25 Drawing Sheets

(56) References Cited

U.S. PATENT DOCUMENTS

| | | | | |
|---|---|---|---|---|
| 2006/0278173 A1* | 12/2006 | Kamijo | ................ | A01K 1/0254 |
| | | | | 119/496 |
| 2009/0184077 A1* | 7/2009 | Curet | .................... | A45D 44/04 |
| | | | | 211/117 |
| 2012/0261306 A1* | 10/2012 | Richardson | ........... | G06F 1/1626 |
| | | | | 206/778 |
| 2016/0206106 A1* | 7/2016 | Labowitz | ................. | B60N 2/44 |

* cited by examiner

ELECTRICALLY INTEGRATED SALON STYLING CHAIR WITH ERGONOMIC EQUIPMENT CADDY This is a continuation-in-part of application Ser. No. 14/172,047, filed Feb. 4, 2016, which claims the benefit of U.S. Provisional Patent Application No. 61/760,635 filed Feb. 4, 2013, the contents of which are hereby incorporated by reference. This application also claims the benefit of U.S. Provisional Patent Application No. 62/261,905 filed Dec. 2, 2015, the contents of which are hereby incorporated by reference.

TECHNICAL FIELD

This description relates generally to salon styling chairs and chair accessories and more specifically to salon styling chairs and accessories coupled to electrical utilities.

BACKGROUND

Stylist chairs are used by barbers and hair stylist. Such chairs typically rotate on a center pedestal, and may be raised and lowered so that a stylist or barber may be provided with an advantageous work position without having to bend or stretch.

SUMMARY

The following presents a simplified summary of the disclosure in order to provide a basic understanding to the reader. This summary is not an extensive overview of the disclosure and it does not identify key/critical elements of the invention or delineate the scope of the invention. Its sole purpose is to present some concepts disclosed herein in a simplified form as a prelude to the more detailed description that is presented later.

The present example provides a salon chair that may include an integrated tool work station or caddy with the capacity to hold a hair dryer, curling irons, clippers, and the like at the rear of the chair. The chair may be powered by an integrated electrical power source inside the chairs' tool compartment and power may be supplied through to the base of the chair. The power source may be connected to an outlet under the chair or concealed under a power extension with cord cover (preventing trips and falls), or may be otherwise coupled to utility power.

Many of the attendant features will be more readily appreciated as the same becomes better understood by reference to the following detailed description considered in connection with the accompanying drawings.

DESCRIPTION OF THE DRAWINGS

The present description will be better understood from the following detailed description read in light of the accompanying drawings, wherein.

Like reference numerals are used to designate like parts in the accompanying drawings.

DETAILED DESCRIPTION

The detailed description provided below in connection with the appended drawings is intended as a description of the present examples and is not intended to represent the only forms in which the present example may be constructed or utilized. The description sets forth the functions of the example and the sequence of steps for constructing and operating the example. However, the same or equivalent functions and sequences may be accomplished by different examples.

The examples below describe a styling chair that includes a caddy (which may be supplied as a separate unit), and/or a unique power distribution system for the chair, which is typically used by hair stylists or barbers. Although the present examples are described and illustrated herein as being implemented in a hair styling system, the system described is provided as an example and not a limitation. As those skilled in the art will appreciate, the present examples are suitable for application in a variety of different types of seating systems where corded instruments may be used in conjunction with providing services to a seated person.

Salon/barber styling chairs are common place for both men and women presenting in a variety of styles and designs. The need for electrically safe and ergonomically correct workstations is highly desirable. Three issues with salon and barber chairs can be: dangling electrical cords connected to styling equipment at the workstation, ineffective power integration to the styling chair as well as styling equipment not ergonomically accessible to the stylist. Therefore, an electrically integrated salon/barber styling chair with ergonomic equipment access is described in this application.

In a typical styling station with a chair, styling equipment and dangling cords are often present. The electrical styling equipment is often kept separate (typically on a bench or counter) from the chair, and during use the stylist keeps going back and for the between the chair and the bench to pick up, or return, a piece of equipment. The present examples allow powered equipment to be within easy reach in a unique caddy disposed on the back of the stylist's chair.

A typical work station with styling equipment usually includes numerous dangling cords. The cords present an untidy clutter, and tend to twist and tangle during use. Often the stylist will pause work to attend to a tangled or twisted cord. Additionally the cords lying on the floor create a safety hazard as they may be tripped over. The present examples allow powered equipment to be close at hand because the unique caddy includes a power source to plug the various pieces of equipment into.

Figure 1:
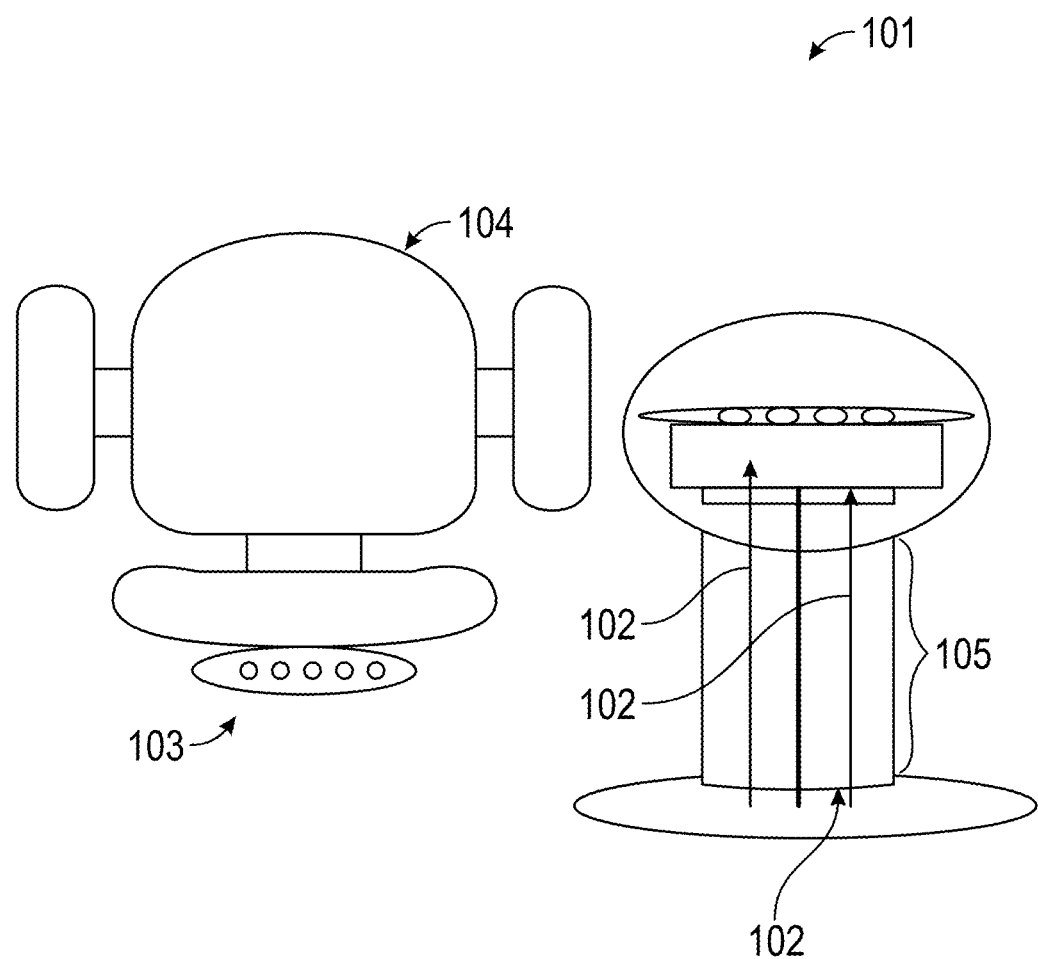
FIG. 1 shows an electrically integrated salon styling chair equipped with an integrated permanent power source in the tool caddy at the rear of the chair.

FIG. 1 shows an electrically integrated salon styling chair 101 equipped with an integrated permanent power source 102 in the tool caddy at the rear of the chair. The chair is designed to provide retractable cords for a hair dryer, curling iron, razor etc. (not shown) which may be stored in a rear tool compartment or compartments 103, which may be of a single size/shape, or varied as needed to accommodate various stylist's tools, where they are easily accessible during use. Power for the appliances or tools may be hard wired to them, or a suitable set of power receptacles may be provided (not shown) The chair 104 is integrated with a typical 15-20 amp power source (or equivalent, running from the back of the chair through to the base 105 of the chair. Power may be provided to the chair by several mechanisms described herein so that the functionality of a standard salon styling chair may be maintained. Typically power is provided in such a way so that the rotation of the chair will not bind with conductors providing power to the caddy 103.

This product may be offered internationally with the appropriate connectors and power sources as required by local jurisdictions.

Figure 2:
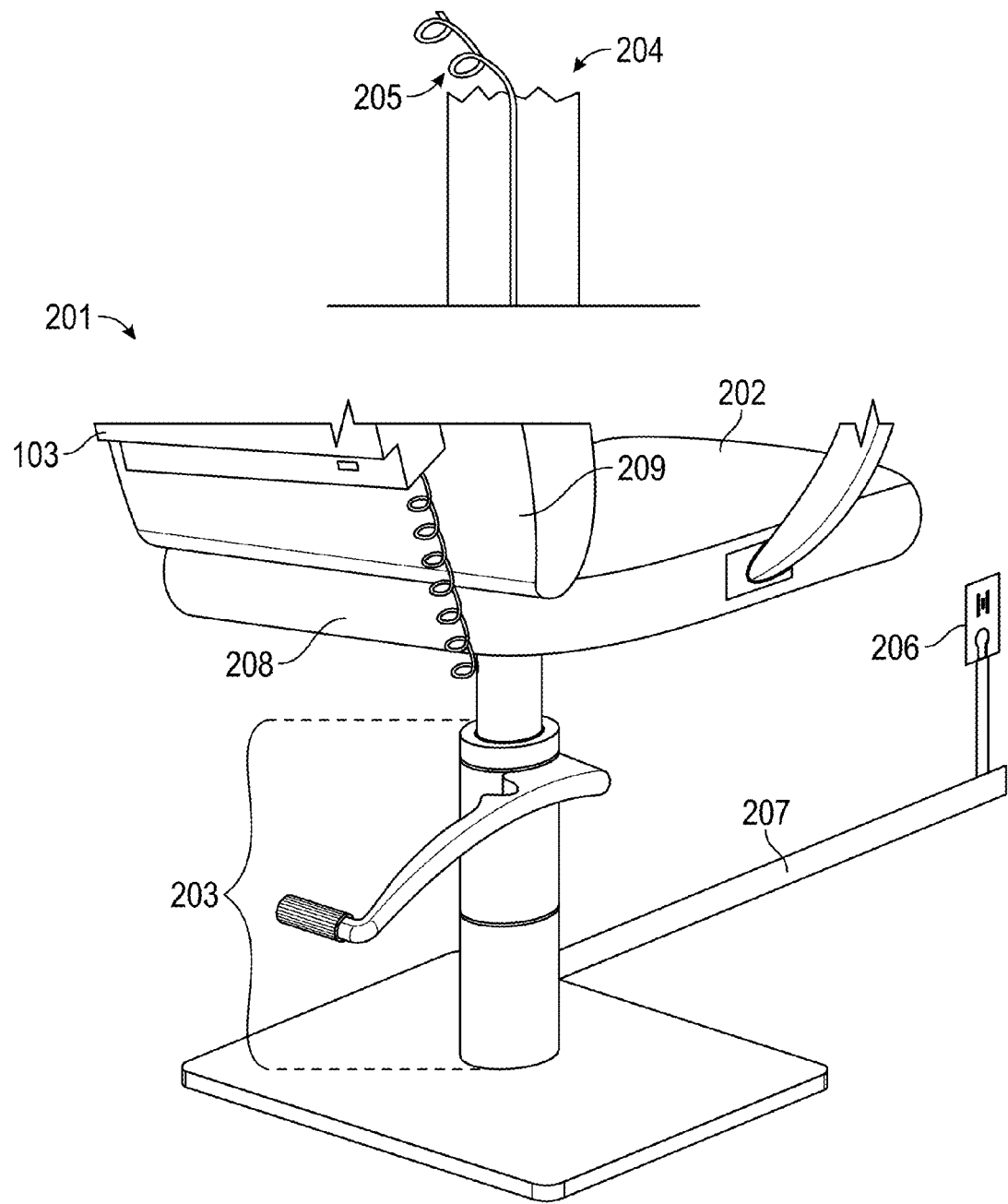
FIG. 2 power design for center support structure with hard stop.

FIG. 2 shows a power distribution design for the chair center support structure (pedestal 203) with hard mechanical stop 201 constructed utilizing conventional techniques. Limiting the rotation of the seat 202 keeps conductors supplying power from twisting, or binding.

On the example shown in detail 204 a 360 degree pre-twist 205 on the electrical cord descending into the center support structure is provided. By adding a hard stop to the center support, there tends to be little or no potential for damaging the cord through torsion or binding. The figure illustrates this hard stop/twist mechanism for the central support structure.

Alternatively, electrical contacts may be disposed within the chair to allow contact to be maintained while the operator turns the chair on the center post. Typically a series of concentric disks might be provided on the floor, with wipers or electrical contacts constructed in the rotating portion of the base 203 to contact the concentric conductor (not shown). Other than the modifications described to provide power to the chair without binding of power cables the stylist, or barber's chair described herein is if typical construction. It is envisioned that the structures described above may be provided in the original design of a stylist's chair, or alternatively may be made to an existing chair as a retrofit, or modification.

The need for a safe electrically integrated and ergonomically functional salon/barber styling chair has been designed to alleviate dangling cords and the potential for trips and falls as well as to provide ergonomic access to styling equipment disposed in the caddy, that may be an add on piece to the stylist chair, or integrally constructed into it.

The intent of this examples described herein is at least two-fold:

First, the chair may be designed with a fixedly attached 10 amp—or other convenient current value—power source for styling equipment (where power originates from an electrically integrated power outlet in the equipment caddy located in the rear of the chair). A pigtail power extension—or other suitable electrical coupling—from the outlet allows for the chair to be adjusted in an upward or downward position, and also allows either partial or full chair rotation. The pigtail from the base may transition to a 10 amp insulated flat cord which extends through the chair infrastructure, down the center chair support to the base of the chair.

Figure 6:
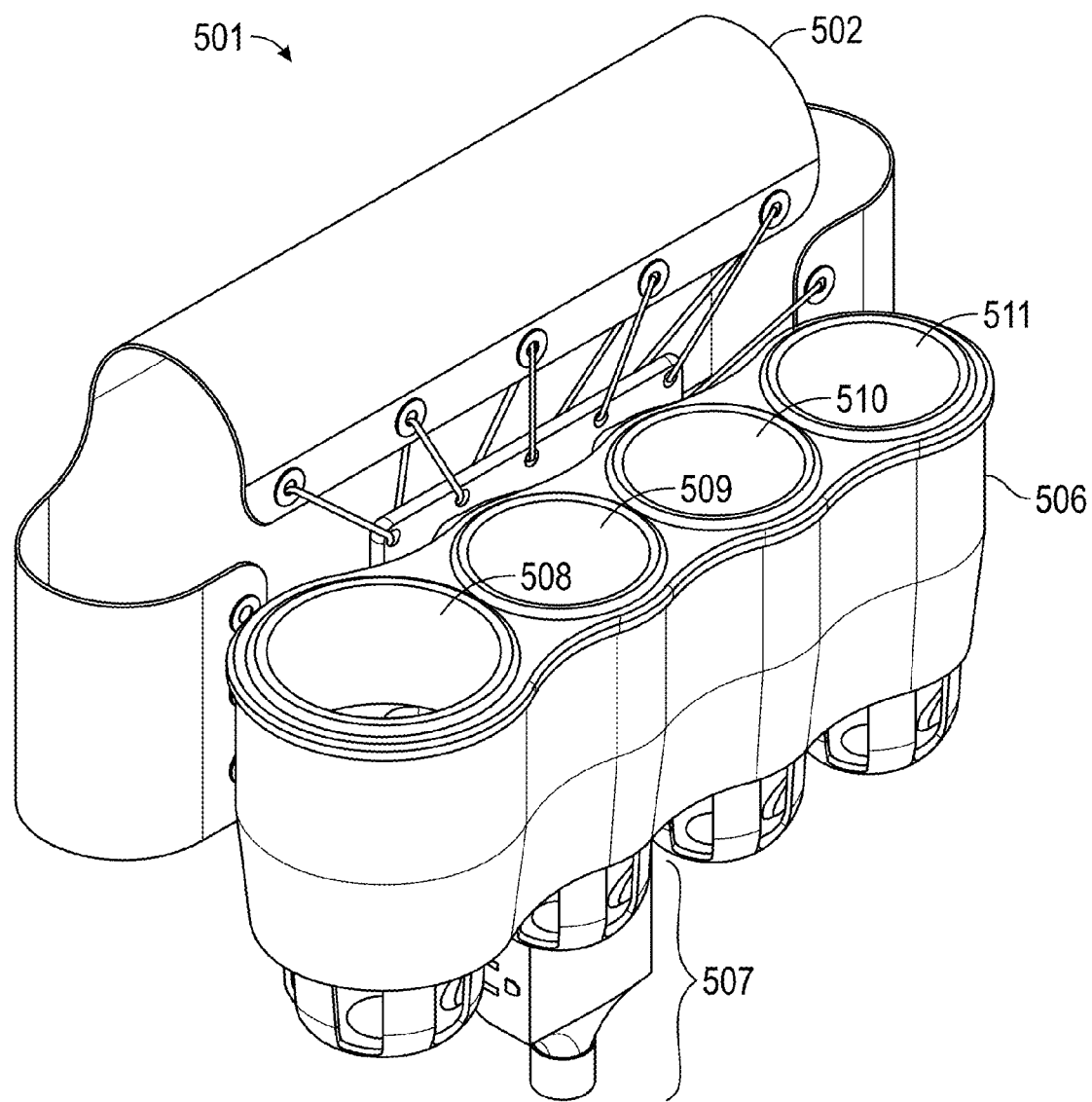
FIG. 6 is a front top left perspective view of a Hair Stylist's Chair Accessory.

Alternatively the cord may bypass the interior support and couple the caddy to power available on the floor beneath it, or may be ran down the exterior of the pedestal. The insulated flat cord may be inserted down the hollow center support structure of the chair with a 360 degree pre-twist. This design allows the chair to rotate no more than 360 degrees before the center shaft strikes a 'hard-stop' preventing damage to the cord. The cord has the ability to be permanently affixed to a floor receptacle or the power source is connected to an outlet concealed under a floor cord 207 cover (preventing trips and falls) and connected to an electrical outlet 206 adjacent to the operator's work station (FIG. 6).

The example illustrated may include the dimensions provided herein. The following dimensions are but one example. Other equivalent configurations are possible. The styling seat and chair back is connected to a ½-¼ inch solid steel tubular frame, or equivalent, and corresponding support structure. Other exemplary dimensions are as follows:
Seat=19" wide×19" deep, or equivalent
Seat back=17" wide×16" high, or equivalent
Floor to seat height 20", or equivalent
Seat travel range 20"-26" high, or equivalent
Center support structure 3-5" wide, or equivalent
Inside dimensions (arm to arm) 19", or equivalent
Outside dimensions (arm to arm) 25", or equivalent
Base dimensions 28"×28", or equivalent
Chair rotation 360 degrees, or other suitable range Second, an ergonomically designed tool caddy 103 and power source 208 may be coupled to the rear of the chair (back) 209 or at another convenient location on the chair.

The rear tool caddy 103 and direct electrical source may be designed to provide a readily accessible tool compartment receptacle for a hair dryer, curling iron, flat iron, razor or the like (not shown). The receptacle can be a single or multiple compartments, or alternatively hangers or the like may be provided to store the equipment on the sear back 209.

Figure 3:
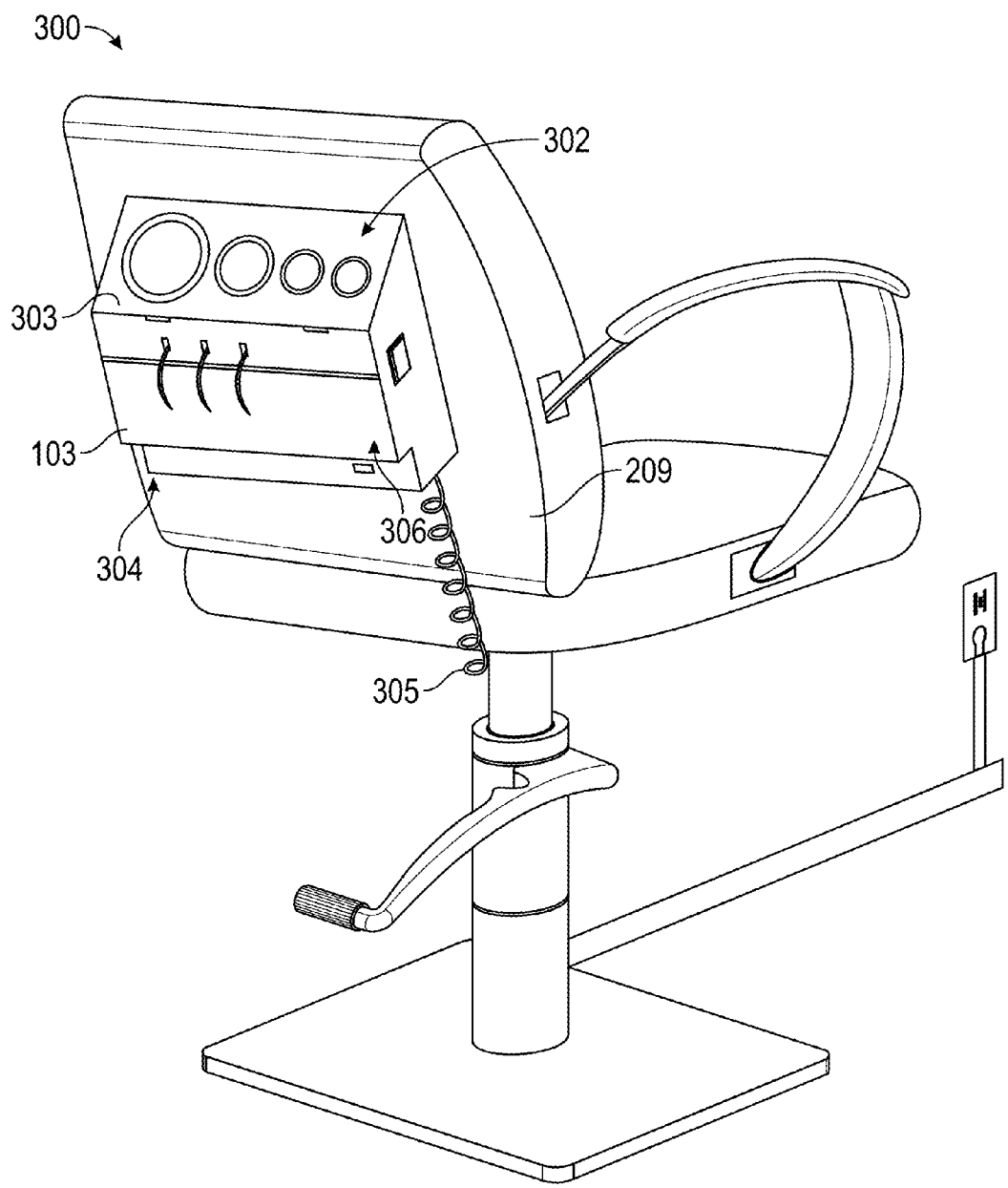
FIG. 3 rear view of chair and equipment caddy.

FIG. 3 is a rear view of chair and equipment caddy. An exemplary caddy 103 may have the following exemplary dimensions (dimensions are exemplary and not limiting):
Height=12"-14"
Width=14"-16"
Depth=4Y2"-5"
Cover Angle=25-30 degrees
Constructed of a high density polymer—or equivalent non conducting material. Or equivalently of a conducting material with a nonconductive coating.

Top may be constructed with a typical four openings 302 or apertures for equipment storage. Alternatively a well structure open at the top to allow access may be provided. The largest opening (3½"-4") may accommodate a hairdryer and be fitted with a precut polymer (or equivalent material) gasket to prevent waste from falling in to the opening when the dryer is removed, and also when it is stored in the opening.

A top panel 303 may be angled to allow for waste material to slide off.

The top may be hinged with a polymer (or equivalent material) self-closing latch (or other fastening device) to allow for cleaning the inside.

Inside the caddy a sleeve structure coupled to the apertures may be constructed with three (or any convenient number of) aluminum (or equivalent material-metal or non-metal), ventilated sleeves approximately 1"-2" diameter for high temperature curling irons/flat irons.

Sides of the caddy may be designed with heat escape vents or other apertures so as not to create a burn or fire hazard. One side may be constructed with a holder for an electric shaver.

Front of the caddy is constructed with a ¼-½" polymer (or equivalent material) bar, rod or the like to hold hair clips, etc.

The base of the caddy may be open 304 to allow for heat dissipation.

The exterior 10 amp (or alternative amperage) power strip 306 which may include an exterior 'On/Off' switch may be attached to a 1"-2" recession at the base of the caddy and may be coupled to an accordion extension cord 305 (or equivalent) external to the caddy housing. Also GFI, and other overload protection (such as temperature sensing) may be provided for safety-either in the caddy, cord or other convenient location in the power circuit.

Any unused receptacles on the power strip 306 may be covered and protected with a plastic electrical cap or its equivalent.

The caddy itself may be constructed to be attached to the rear of the chair with a 1" long 'J-shaped' (or equivalent) metal (or equivalent material) bracket with an opening of approximately ¼" inch allowing it to affix to the rear of the chair with four self-tapping pan head screws, or other equivalent coupling mechanism, or hardware. Alternatively, other equivalent methods of support or attachment may be provided such as a cloth or web harness to fit over the back of the chair.

Figure 4:
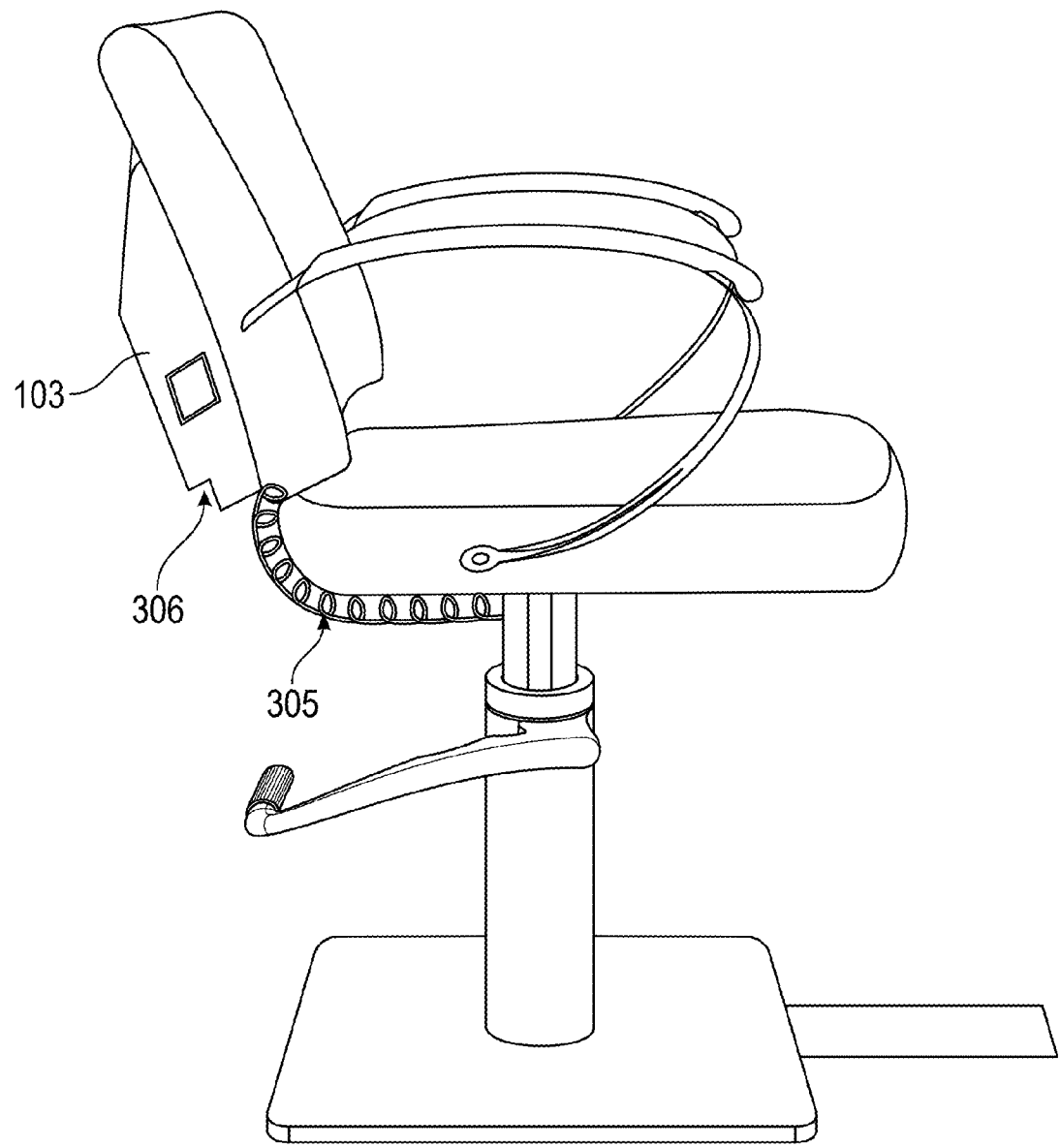
FIG. 4 side profile of chair with electrical retrofit equipment caddy.

FIG. 4 is a side profile of chair with an electrical retrofit equipment caddy 103. The chair may be offered as a new product or retrofitted with an adaptor kit. The adaptor kit may be a stand-alone design or product. The adaptor kit may include several versions of mounting hardware to accommodate various chair types that are commercially available. In addition a retrofit kit for the electrical connections associated with the pedestal may also be included.

FIGS. 5-14 show a further example of hair stylist's chair accessory or caddy 501, shown in various views. This example 501 allows coupling to the seat back via a flexible member 502. Flexible member 502 may be plastic, fabric, mesh or the like. Flexible member 502 may be molded, woven, or the like. A plurality of apertures 503 are disposed about the perimeter of the flexible member 502 that wrap around to the back of the chair back. The perimeter of the flexible member may be reinforced to strengthen the apertures 503. Likewise the apertures 503 may be reinforced with grommets, eyelets or the like.

The flexible member 502 couples to a back plate of the caddy 505, by string, cord, elastic cord or the like 504 to a back plate of the caddy 505. The back plate 505 includes apertures 507 to accept the cord 504. The string 504 allows adjustment of the caddy so that it fits a wide variety of chair backs, and allows tightening so that the hair stylists chair accessory 501 remains securely in place. Multiple strings, and alternative lacing patterns may equivalently be substituted for those shown.

A molded housing 506 is coupled to the back plate 505 by conventional fastening techniques. Alternatively the back plate 505 and housing 505 may be a single unitary piece, typically molded together.

The housing 506 is typically molded from a plastic, or equivalent material. Although one or more equivalent materials may be substituted. The housing 506 may be molded as a single piece, or alternatively form several pieces and assembled using well known fastening techniques.

An electrical supply 507 may be coupled to the housing 506 and or back plate 505. Electrical supply 507 may include one or more electrical receptacles so that powered stylist's tools (not shown) may draw power from the hair stylists chair accessory 501. The electrical supply may include a fixed or removable cord (not shown) and may also include circuitry as previously described (306 of FIG. 3). The electrical supply 507, may be pivotally coupled to the housing or back piece to allow some degree of movement during use.

The housing 506 is where the stylist's tools may be stored. Wells may be formed in the housing 506 to accommodate the various stylist's tools (not shown). The wells are accessed via exemplary apertures 508, 509, 510, 511. Equivalently the apertures may be of various sizes, to accommodate various tools, and also fewer, or more apertures may be provided for differing numbers of tools, as desired. The apertures 508, 509, 510, 511 are shown as round however various shapes may be employed, including compound shapes, or the like to accommodate different tools.

The bottoms of the wells, opposite to the apertures 508, 509, 510, 511, may include let out areas, or apertures 512 molded into the housing 506, to allow heat dissipation, or for hair to fall through. Alternatively these wells may be formed from one or more separate pieces attached or coupled to the housing 506, and to each other (if including more than one piece). A dish shaped piece 701 may be coupled via a plurality of finger shaped substantially flat members 702 to the housing 506. The dish shaped piece may include an aperture 703 disposed in its bottom, Alternatively, some of the wells may be provided without let out places 512, or alternatively the let out places 512 may be omitted entirely. The stylists tools (not shown) may be plugged into the power or electrical supply 507, and the tools stored in the various apertures 508, 509, 510, 511, and be at hand for convenient use by the stylist.

Figure 5:
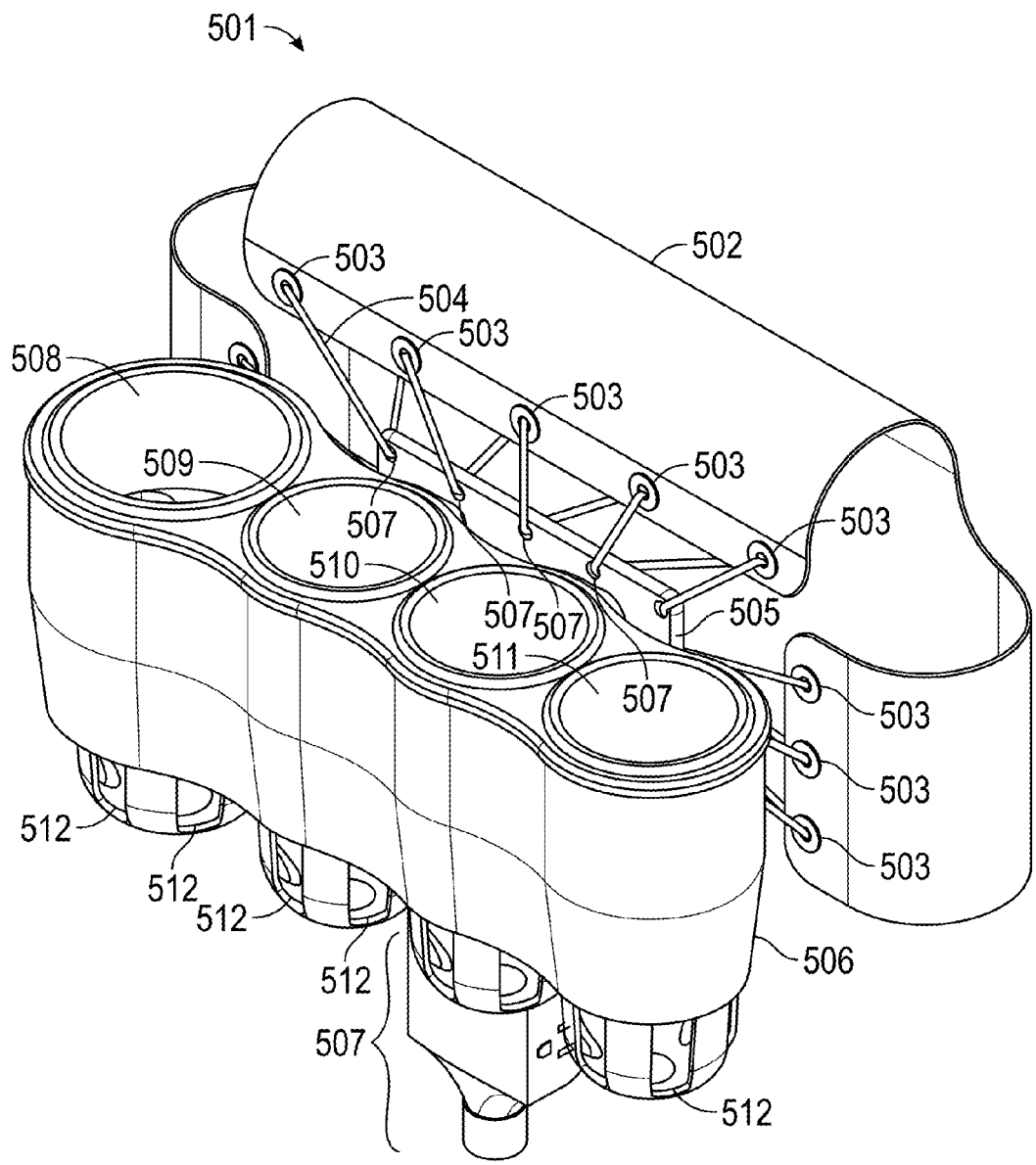
FIG. 5 is a front top right perspective view of a Hair Stylist's Chair Accessory.

FIG. 5 is a front top right perspective view of a Hair Stylist's Chair Accessory.

FIG. 6 is a front top left perspective view of a Hair Stylist's Chair Accessory.

Figure 7:
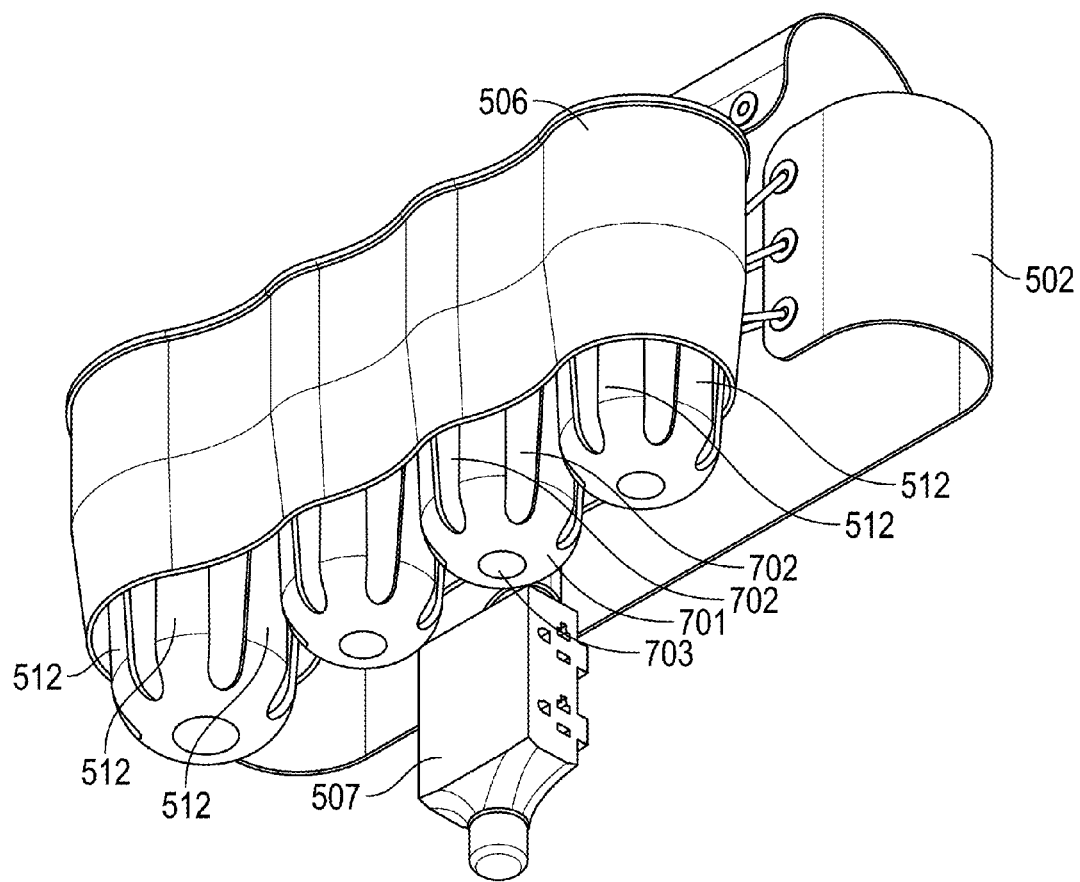
FIG. 7 is a front bottom right perspective view of a Hair Stylist's Chair Accessory.

FIG. 7 is a front bottom right perspective view of a Hair Stylist's Chair Accessory.

Figure 8:
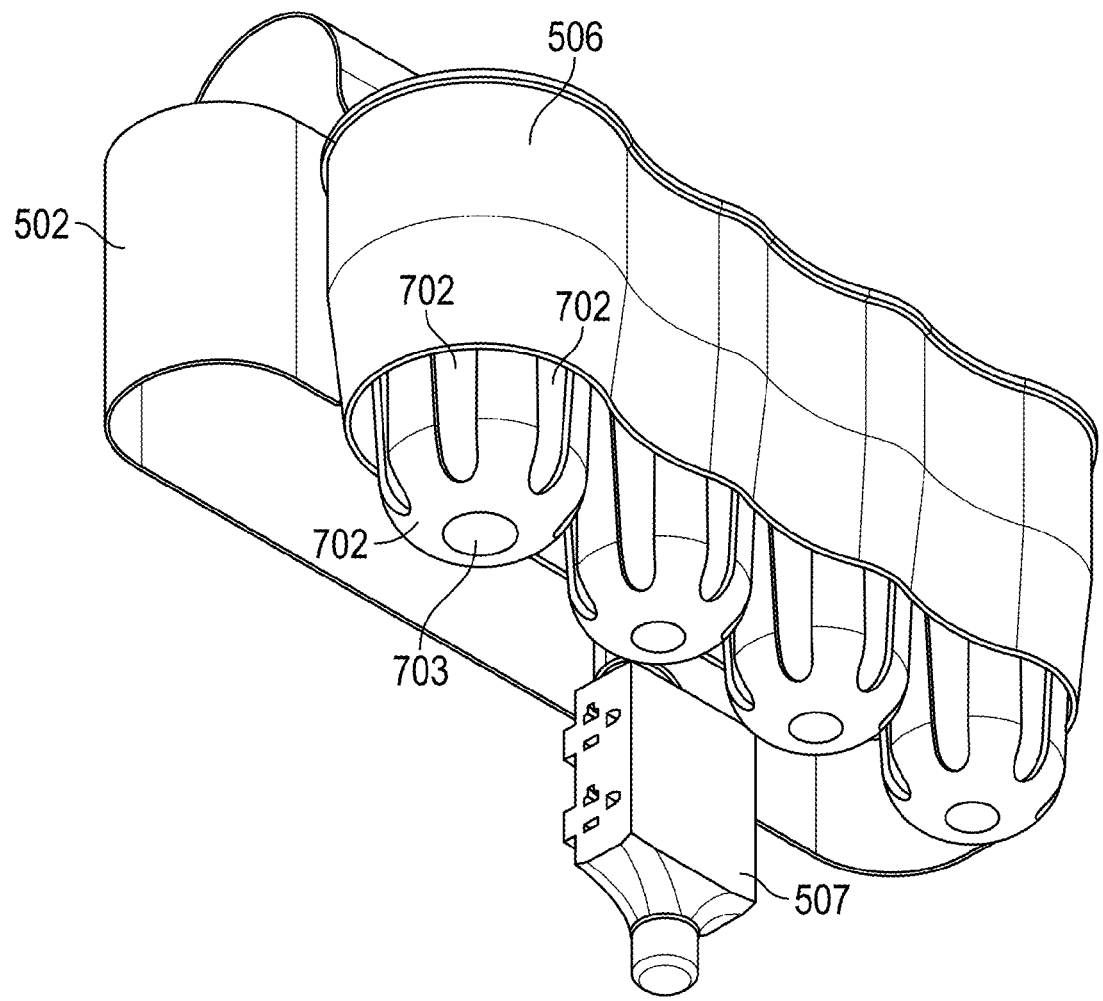
FIG. 8 is a front bottom left perspective view of a Hair Stylist's Chair Accessory.

FIG. 8 is a front bottom left perspective view of a Hair Stylist's Chair Accessory.

Figure 9:
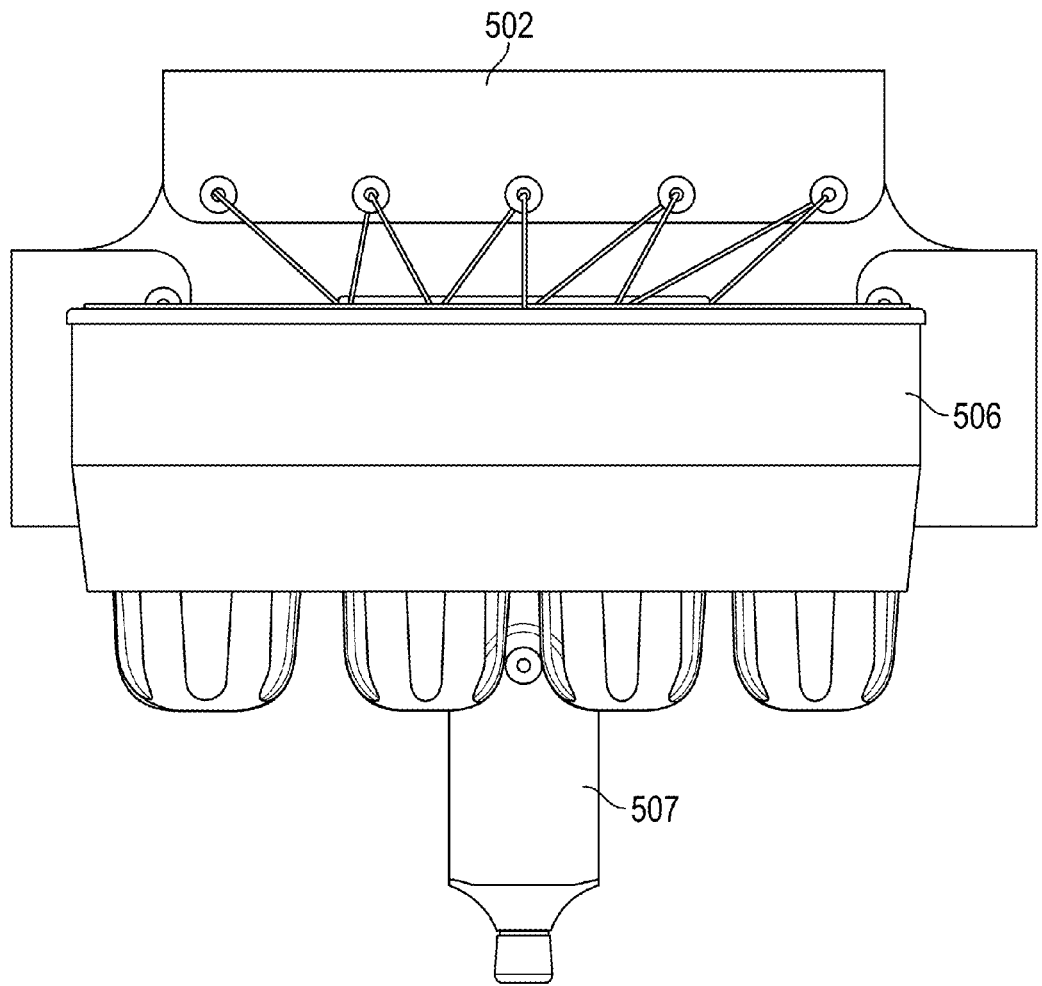
FIG. 9 is a front view thereof.

FIG. 9 is a front view thereof.

Figure 10:
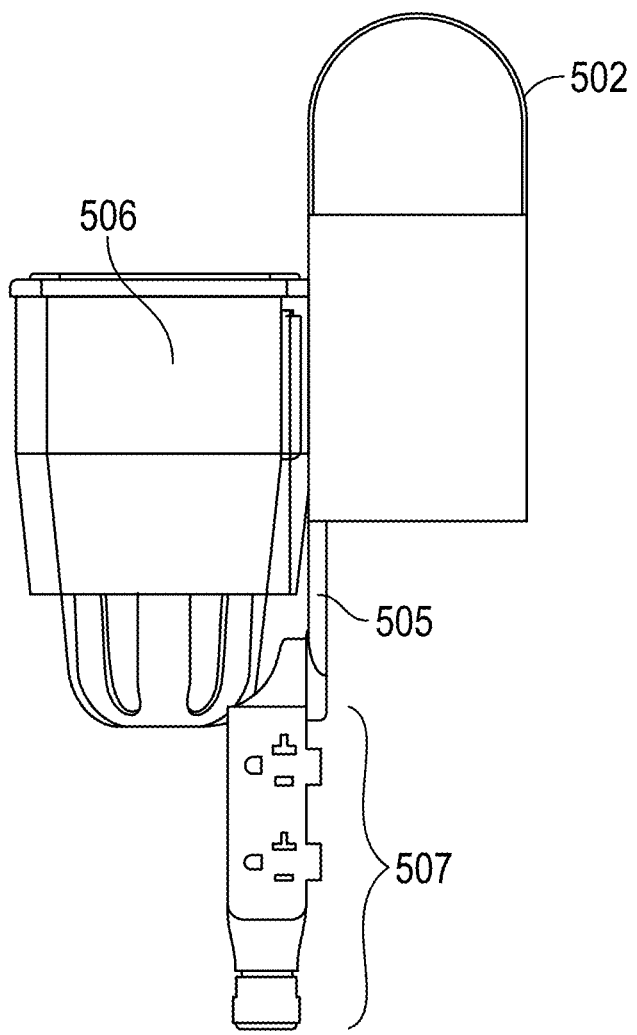
FIG. 10 is a right view thereof.

FIG. 10 is a right view thereof.

Figure 11:
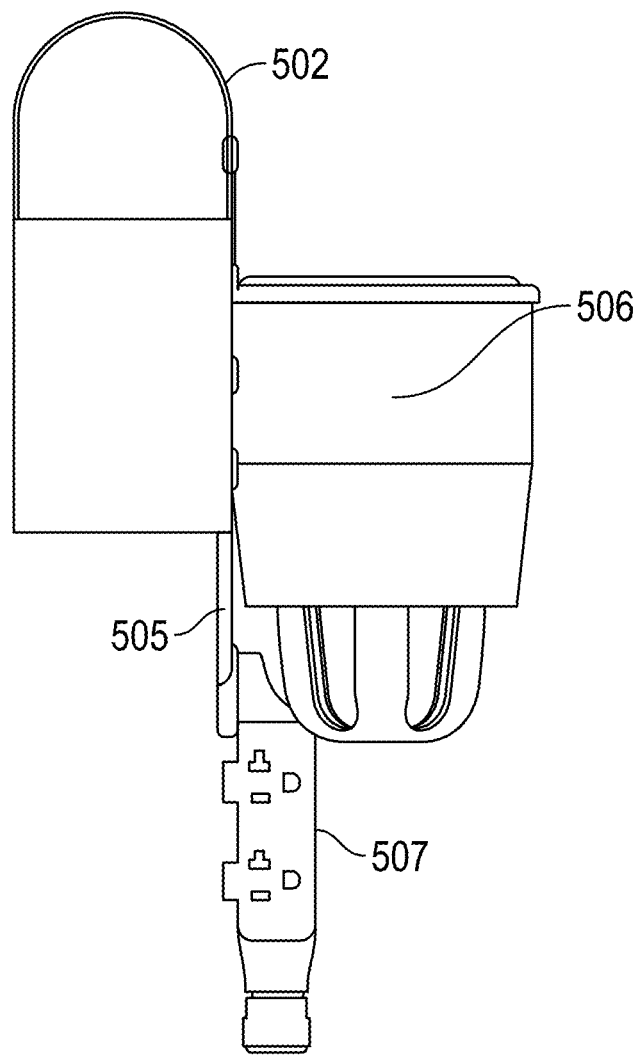
FIG. 11 is a left view thereof.

FIG. 11 is a left view thereof.

Figure 12:
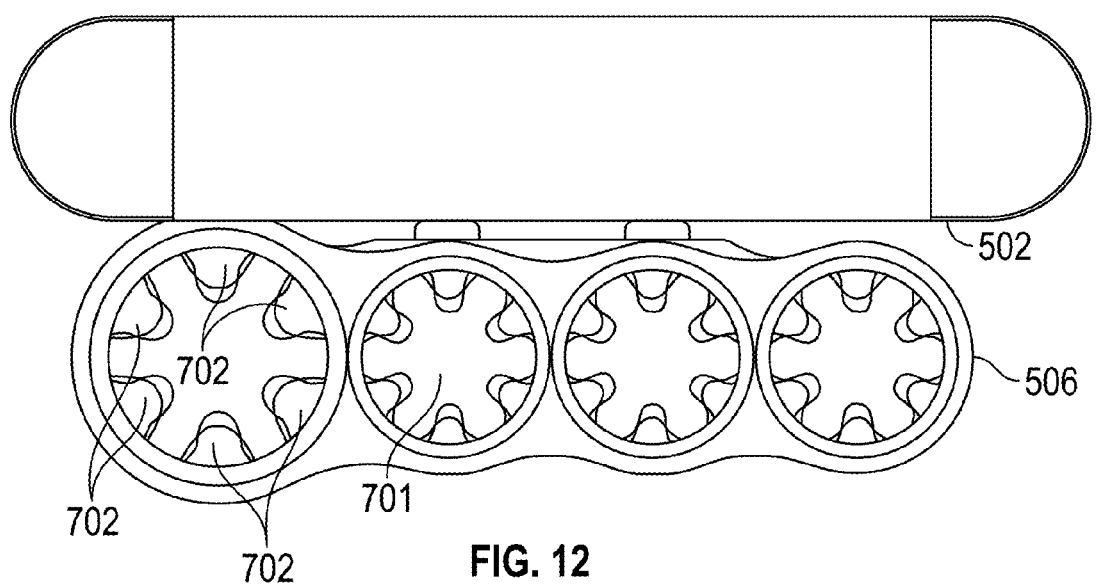
FIG. 12 is a top view thereof.

FIG. 12 is a top view thereof.

Figure 13:
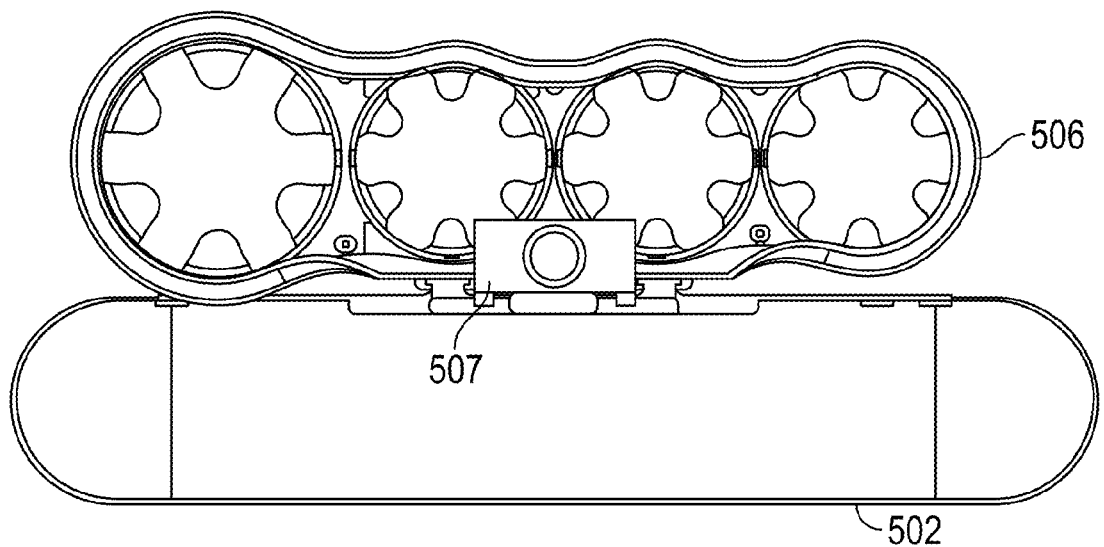
FIG. 13 is a bottom view thereof.

FIG. 13 is a bottom view thereof. and

Figure 14:
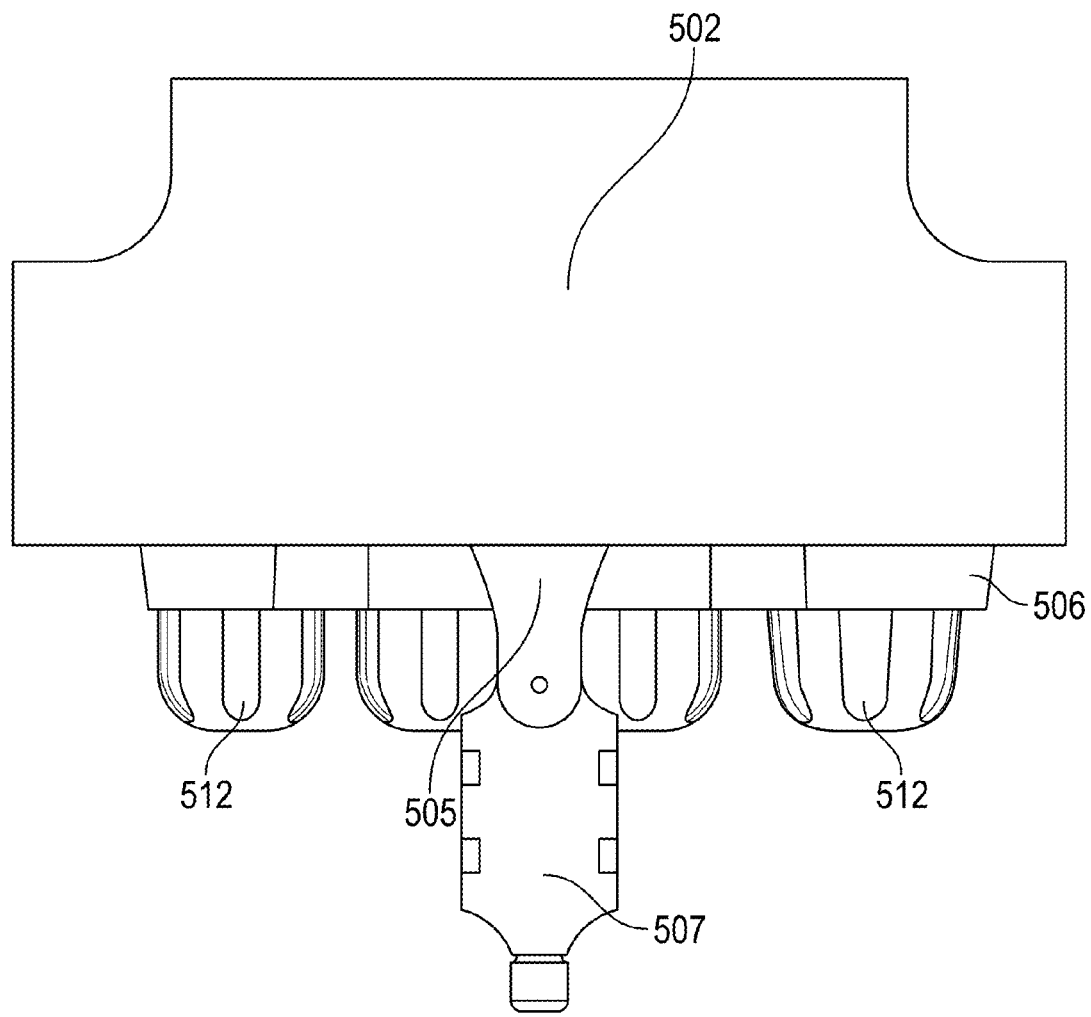
FIG. 14 is a rear view thereof.
Figure 15:
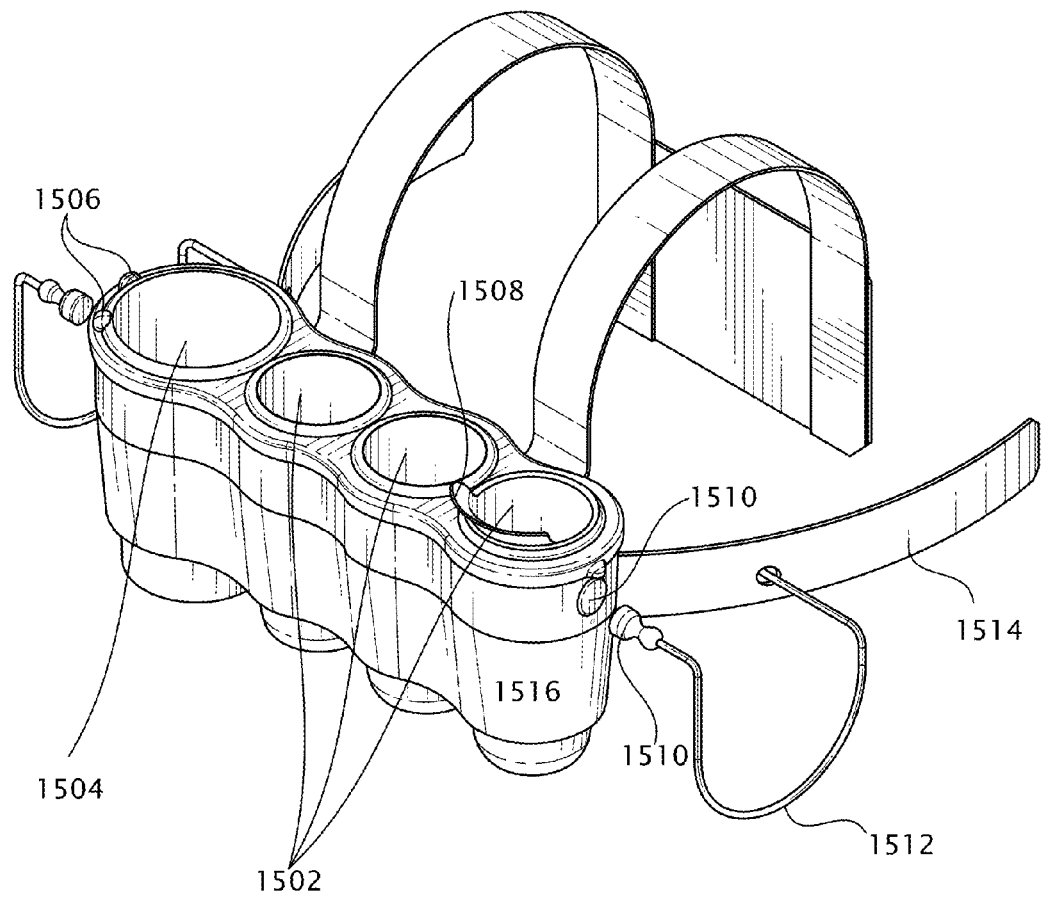
FIG. 15 is a front top right perspective view of a Hair Stylist's Chair Accessory With Mounting Straps showing my new design.
Figure 16:
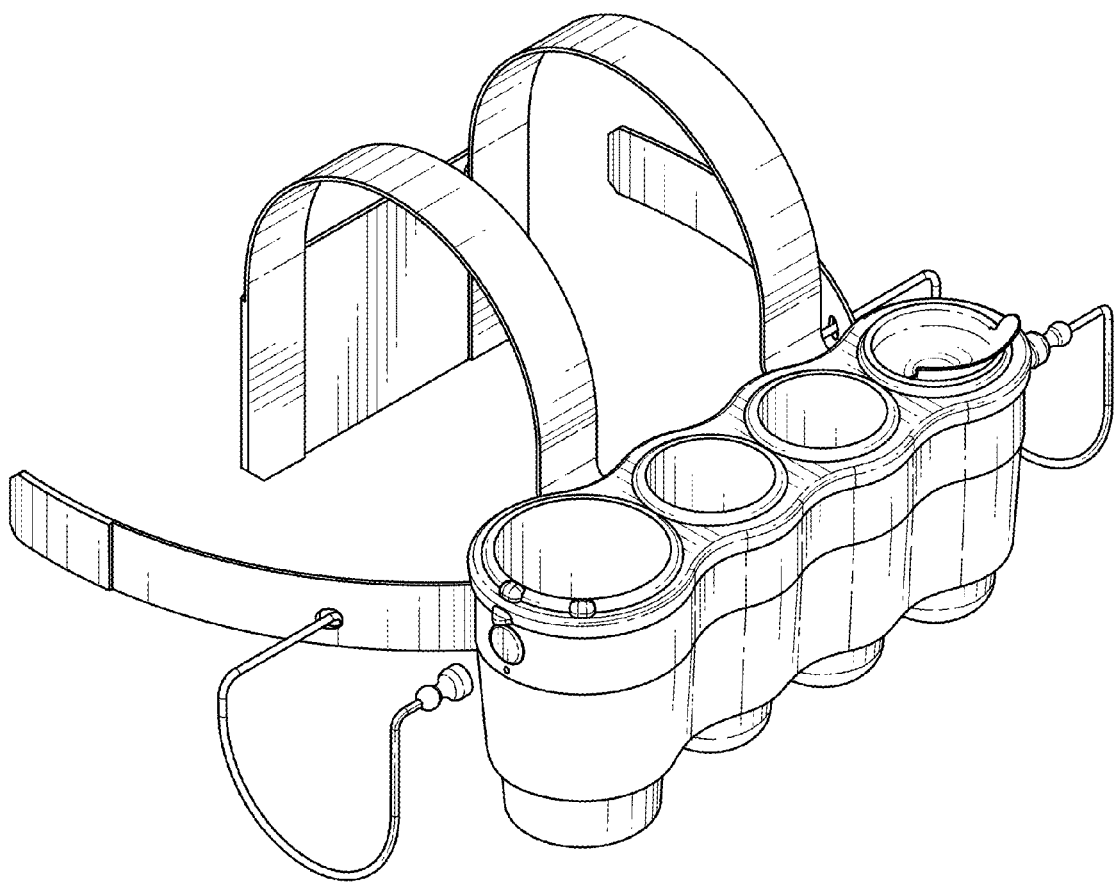
FIG. 16 is a front top left perspective view of a Hair Stylist's Chair Accessory With Mounting Straps showing my new design.
Figure 17:
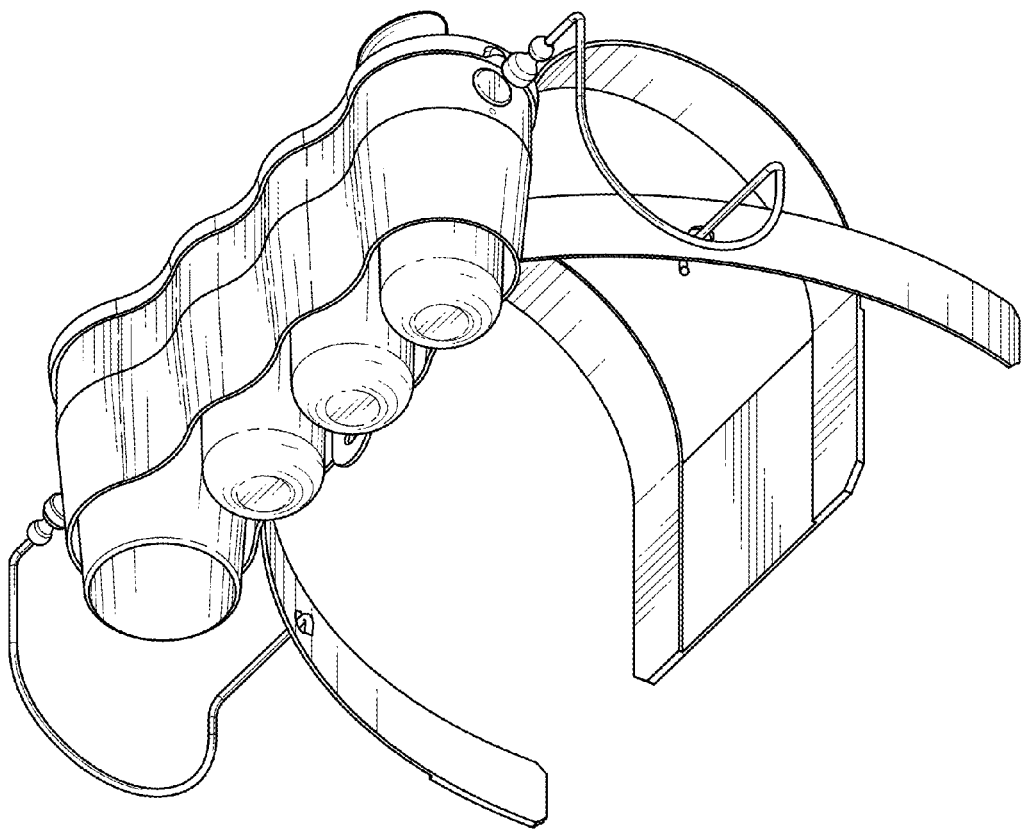
FIG. 17 is a front bottom right perspective view of a Hair Stylist's Chair Accessory With Mounting Straps showing my new design.
Figure 18:
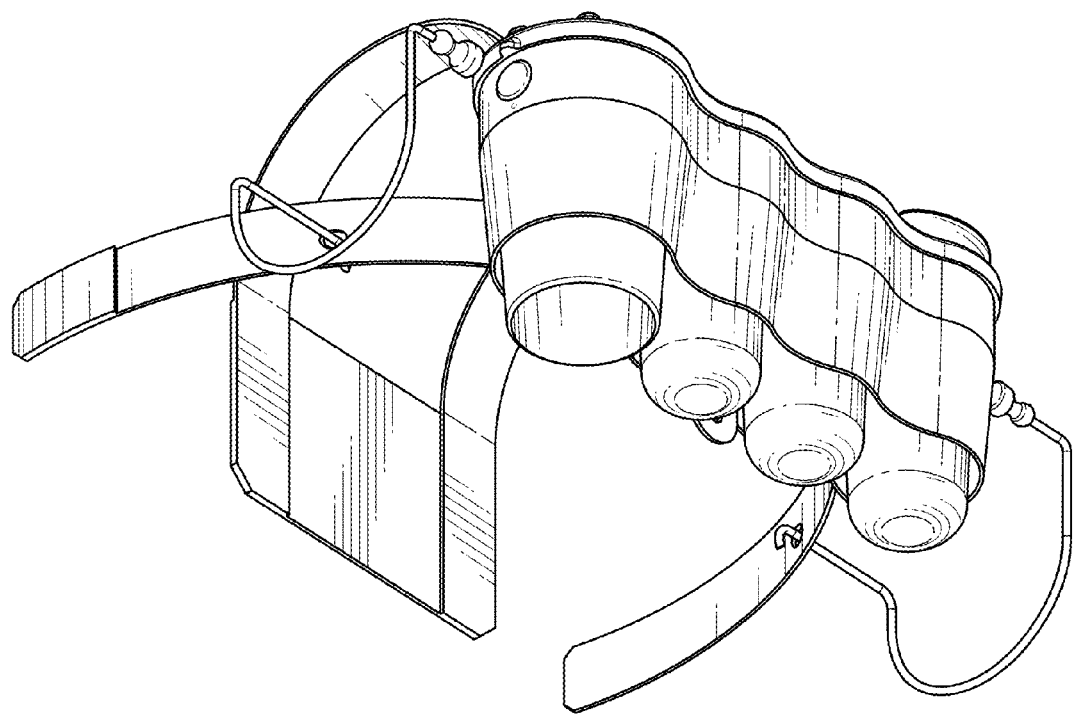
FIG. 18 is a front bottom left perspective view of a Hair Stylist's Chair Accessory With Mounting Straps showing my new design.
Figure 19:
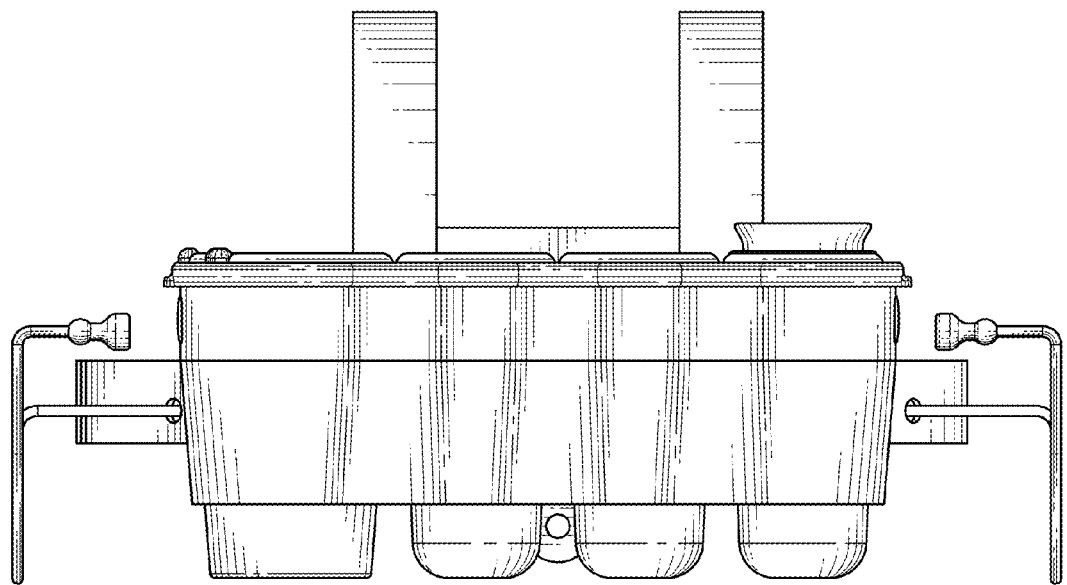
FIG. 19 is a front view thereof.
Figure 20:
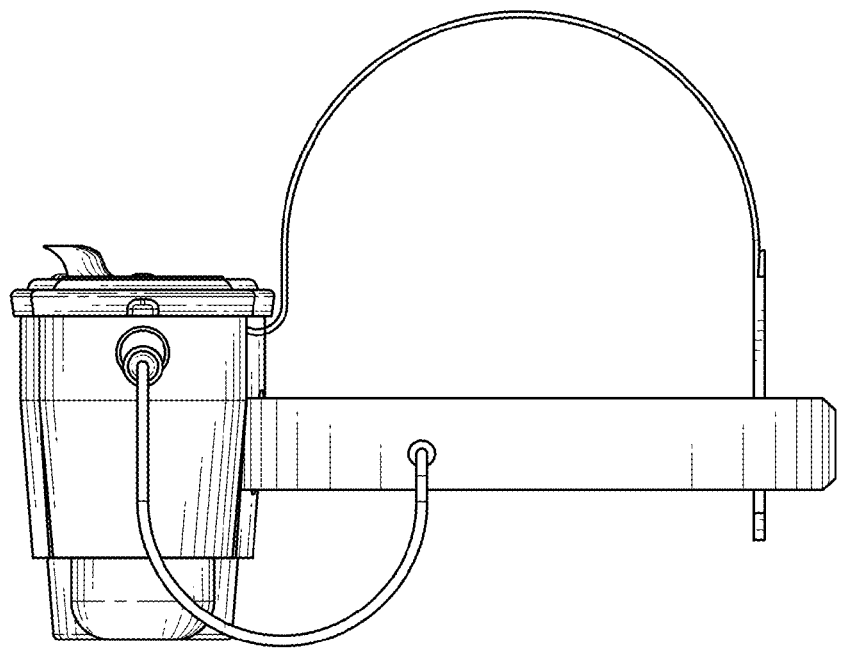
FIG. 20 is a right view thereof.
Figure 21:
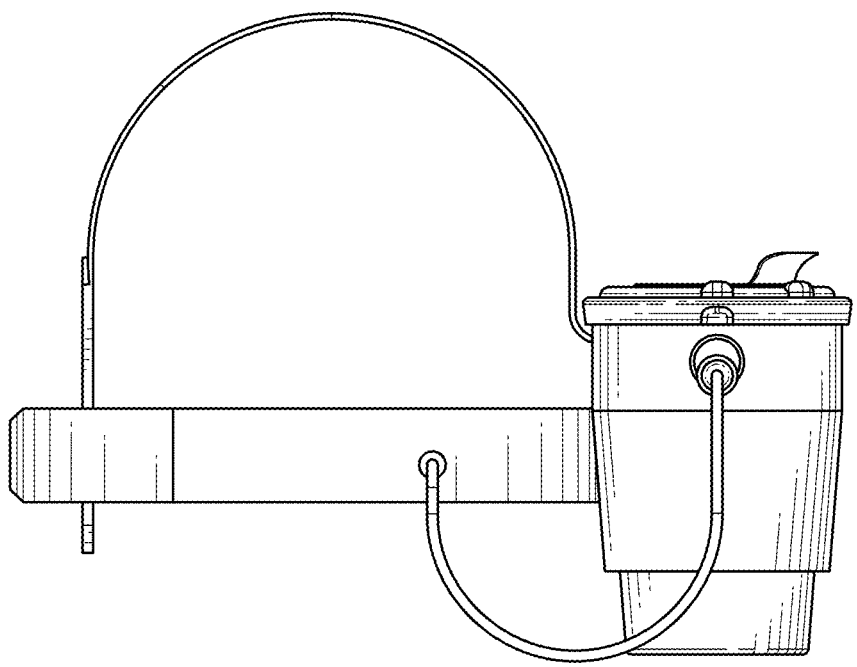
FIG. 21 is a left view thereof.
Figure 22:
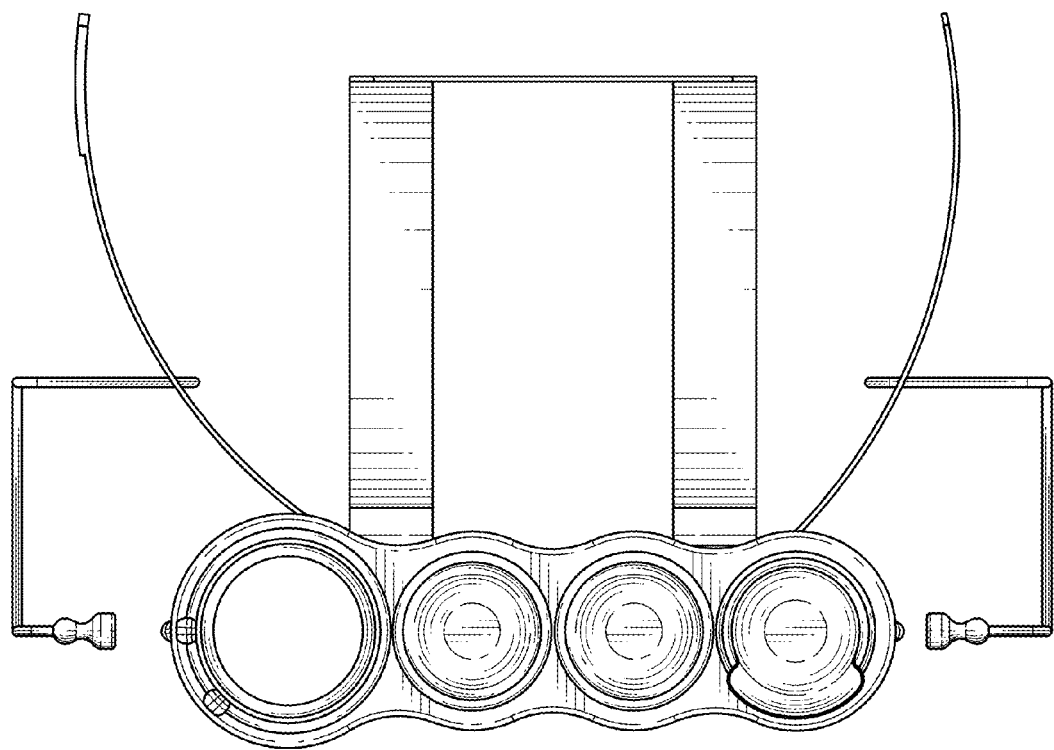
FIG. 22 is a top view thereof.
Figure 23:
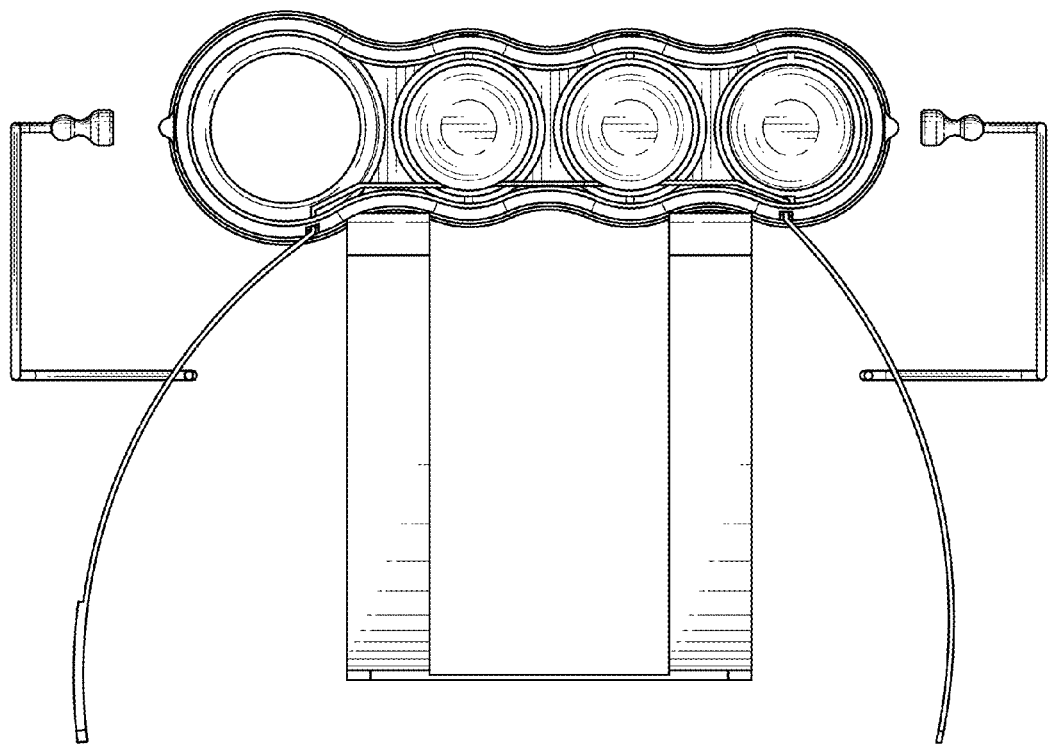
FIG. 23 is a bottom view thereof.
Figure 24:
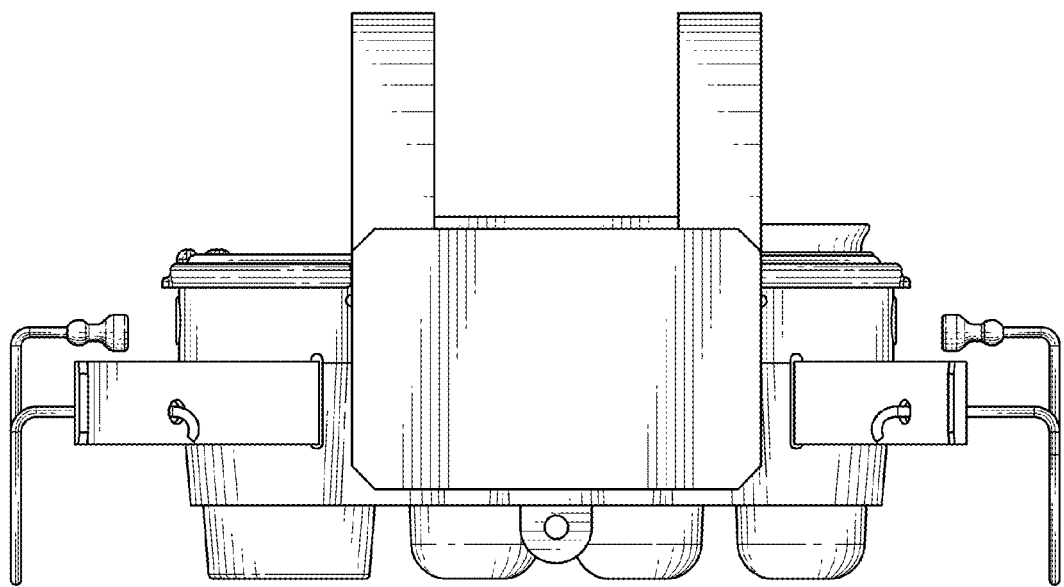
FIG. 24 is a rear view thereof.

FIG. 14 is a rear view thereof.

FIGS. 15-24 shows a Hair Stylist's Chair Accessory With Mounting Straps.

The Top Housing and Sheathe are manufactured with a high gloss finish out of chemical and heat-resistant polyurethane or equivalent. These two pieces interface with a click-in action at 10 points, and can be removed from each other for cleaning.

Cup storage system features three small cups 1502 for tools such as flat irons and curling irons, and one large cup for blow dryers. The large cup 1504 is bottomless as to allow large blow dryer accessory nozzles to pass through. The large cup features two small protruding knobs 1606 that help keep the blow dryer handle oriented off to the left side of the device.

Removable accessory cups slide into the small cups and feature a shallow basin ideal for holding small objects such as bobby pins, as well as for mixing and holding hair color dye. A lip 1508 on the front allows the stylist to dab their brush to remove excess hair coloring liquid.

Magnetic knobs 1510 on the sides of the unit contain powerful neodymium magnets that hold the customer's cape to the side. The knobs pinch the cloak to the housing for the duration of the styling procedure. The knobs are attached to the Mounting Strap 1514 with elastic cord 1512 to keep them from getting lost.

The Magnetic Knob Cord is designed to prevent the Magnetic Knob from falling onto the ground when dropped. One end of this cord is fused to the Magnetic Knob, and the other end of the cord is attached to a fixture point on the Mounting Strap.

The Mounting Strap is designed to feed through the slots on the back of the Sheathe 1516. The Mounting Strap has a Velcro mounting system that can adapt to chairs of different sizes using strategically-placed elastic strap. The Mounting Strap is made of durable and easy to clean fabric with high quality stitching.

Two small holes built into the Top Housing are designed to hold various types of scissors, including cutting shears (smaller left-side hole) and thinning shears (larger right-hand hole).

The Power Hub (not shown) is electrically suited for the high-amperage draw of most styling tools. It features four power ports and is mounted to the bottom of the product at a loophole built into the Mounting Strap. The Power Hub is allowed to hang freely as to allow easy positioning when inserting and removing plugs. This free hanging style also reduces torque placed on the Sheathe, extending the lifespan of the product.

Each product comes with cord organization accessories such as zip ties, spring clips and ribbed tubing that allows each user to customize the way their tool cords hang. These accessories help keep the cords off the floor which helps with sanitation and clean-up.

Figure 25:
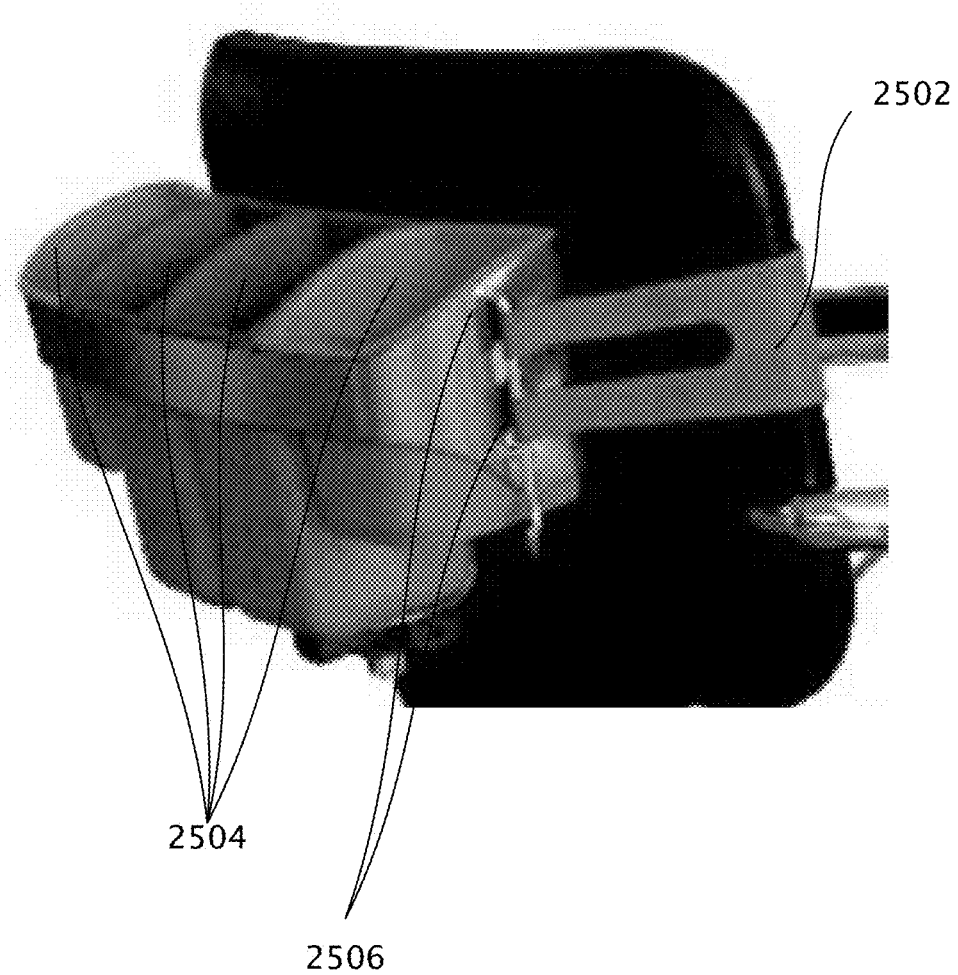
FIG. 25 shows a further alternative example having a single band and hook and loop fastening.

FIG. 25 shows a further alternative example having a single band 2502 and hook and loop fastening. Here a single band which may be made of an elastic material may encircle the back of the chair. The band is secured and adjusted via hook and loop tape disposed on the band. The containers 2504 may be silicone lined. And may be equipped with a wiping edge upon which brushes for applying hair dye or the like may be wiped. The band loops through apertures 2606 on the caddy back.

Those skilled in the art will realize that the process sequences described above may be equivalently performed in any order to achieve a desired result. Also, sub-processes may typically be omitted as desired without taking away from the overall functionality of the processes described above.

The invention claimed is:

1. A hair styling caddy comprising:
 a endless loop housing comprising a one-piece sheet ring defining a generally elongate rectangular through opening and having opposite longitudinal ends;
 a plurality of containers, each of the plurality of containers abutting another of the plurality of containers and forming a row of the containers that fills the through opening of the housing;
 at least one elongated element mounted on each longitudinal end of the housing and forming respective apertures on the opposite longitudinal ends; and
 an elongate material band having longitudinal ends, each longitudinal end of the material band comprising a hook material and a loop material of a mating hook and loop fastener, and each longitudinal end looped through a respective one of the apertures and adjustably attached to itself by the respective mating hook and loop fastener;
 wherein the housing with the plurality of containers is supported on a rear face of a backrest of a chair by the elongate material band extending around a front face of the backrest to encircle the backrest together with the housing.

2. The hair styling caddy of claim 1, further comprising an electrical supply coupled to the housing.

3. The hair styling caddy of claim 2, wherein the electrical supply includes at least one electrical receptacle.

4. The hair styling caddy of claim 1, wherein the housing comprises molded plastic.

5. The hair styling caddy of claim 1, wherein at least one of the plurality of containers comprises a wiping edge in a form of a lip extending from an upper edge, the lip adapted for wiping a dye brush.

6. The hair styling caddy of claim 1, wherein the plurality of containers comprises containers of different depths.

7. The hair styling caddy of claim 1, wherein the elongate material band comprises an elastic material.

8. The hair styling caddy of claim 1, wherein at least one of the containers of the plurality of containers is lined with silicone.

* * * * *